(12) United States Patent
Yabe

(10) Patent No.: US 6,847,542 B2
(45) Date of Patent: Jan. 25, 2005

(54) SRAM CELL AND INTEGRATED MEMORY CIRCUIT USING THE SAME

(75) Inventor: Tomoaki Yabe, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/449,536

(22) Filed: Jun. 2, 2003

(65) Prior Publication Data

US 2004/0114422 A1 Jun. 17, 2004

(30) Foreign Application Priority Data

Dec. 17, 2002 (JP) ........................................ 2002-365257

(51) Int. Cl.[7] ............................................. G11C 11/00
(52) U.S. Cl. ........................................ 365/154; 365/205
(58) Field of Search ................................. 365/154, 205, 365/189.01

(56) References Cited

U.S. PATENT DOCUMENTS

| | | | |
|---|---|---|---|
| 5,627,789 A | * 5/1997 | Kalb, Jr. | ................... 365/205 |
| 5,831,896 A | 11/1998 | Lattimore et al. | |
| 6,130,470 A | * 10/2000 | Selcuk | ................... 257/534 |
| 6,519,176 B1 | * 2/2003 | Hamzaoglu et al. | ........ 365/154 |

OTHER PUBLICATIONS

Kevin Zhang, et al., "The Scaling of Data Sensing Schemes for High Speed Cache Design in Sub–0.18μm Technologies", 2000 Smyposium on VLSI Circuits Digest of Technical Papers, 2000, pp. 226–227.

* cited by examiner

Primary Examiner—Thong Q. Le
(74) Attorney, Agent, or Firm—Oblon, Spivak, McClelland, Maier & Neustadt, P.C.

(57) ABSTRACT

An SRAM cell comprising a first inverter comprising a first load element and a first driver NMOSFET, a second inverter comprising a second load element and a second driver NMOSFET and having input and output terminals cross-coupled to output and input terminals of the first inverter, respectively, a first transfer gate NMOSFET having a current path inserted between the first inverter and a first bit line and a gate connected to a word line, and a second transfer gate NMOSFET having a current path inserted between the second inverter and a second bit line and a gate connected to the word line, wherein a current drivability of the first inverter and the first transfer gate NMOSFET for the first bit line is set to be larger than that of the second inverter and the second transfer gate NMOSFET for the second bit line.

14 Claims, 5 Drawing Sheets

SRAM CELL AND INTEGRATED MEMORY CIRCUIT USING THE SAME

CROSS-REFERENCE TO RELATED APPLICATIONS

This application is based upon and claims the benefit of priority from the prior Japanese Patent Application No. 2002-365257, filed Dec. 17, 2002, the entire contents of which are incorporated herein by reference.

BACKGROUND OF THE INVENTION

1. Field of the Invention

The present invention relates to an SRAM (Static Random Access Memory) cell and an integrated memory circuit using the same and, more particularly, to a circuit arrangement and pattern layout of an SRAM cell which is used for, e.g., an SRAM integrated circuit, SRAM-embedded integrated logic circuit, or the like.

2. Description of the Related Art

SRAM cells include a type comprising four MOSFETs (insulated gate type field effect transistors) and two load resistive elements and a type comprising six MOSFETs (6-transistor SRAM cell). Further, a type comprising five MOSFETs (5-transistor SRAM cell) is disclosed in U.S. Pat. No. 5,831,896.

Figure 6:
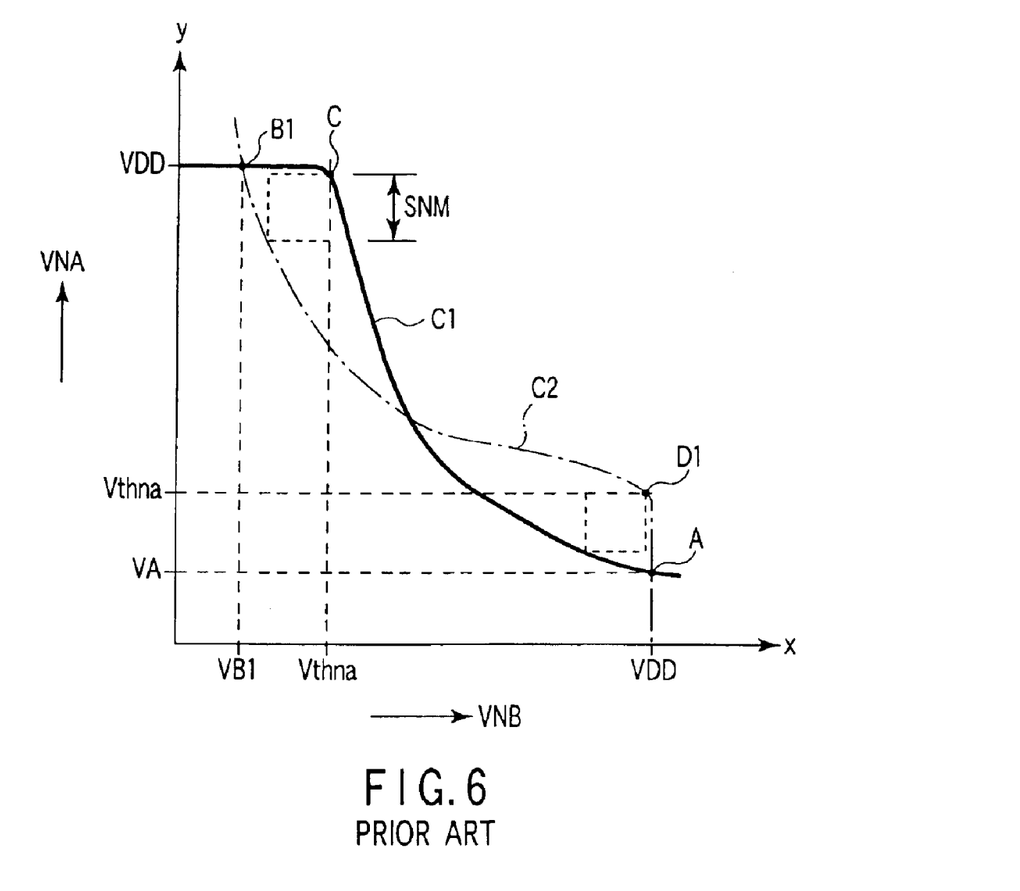
FIG. 6 is a graph showing a butterfly curve representing the stability of a conventional SRAM cell.

FIG. 6 shows a butterfly curve representing the stability of a conventional 6-transistor SRAM cell. As is well known, first to fourth transistors in the 6-transistor SRAM cell constitute first and second inverters connected to form a flip-flop circuit which has first and second storage nodes. The first storage node which is an output node of the first inverter is connected to one of a pair of bit lines via a fifth transistor (transfer gate transistor) of the cell and the second storage node which is an output node of the second inverter is connected to the other of the pair of bit lines via a sixth transistor (transfer gate transistor) of the cell. Gates of the fifth and sixth transistors are connected to a word line.

FIG. 6 shows an input/output characteristic curve (transfer curve) C1 of the first inverter provided in one SRAM cell. The SRAM cell has first and second storage nodes. The characteristic curve C1 of the first inverter represents a relationship between a second storage node potential VNB as an input voltage along an abscissa x and a first storage node potential VNA as an output voltage along an ordinate y.

An input/output characteristic curve C2 of the second inverter in the SRAM cell represents a relationship between the first storage node potential VNA as an input voltage along the ordinate and the second storage node potential VNB as an output voltage along the abscissa. The word line and the pair of bit lines, which are connected to the SRAM cell, are biased to a power supply voltage VDD.

In FIG. 6, an intersection A between the two input/output characteristic curves C1 and C2 represents a state wherein the first storage node potential VNA is at a low level "L", the second storage node potential VNB is at a high level "H", and the SRAM cell holds "0" data.

Conversely, an intersection B1 between the two input/output characteristic curves C1 and C2 represents a state wherein the first storage node potential VNA is at a high level "H", the second storage node potential VNB is at a low level "L", and the SRAM cell holds "1" data.

The length of one side of the maximum square denoted by a broken line in FIG. 6 that is inscribed to two regions surrounded by the two input/output characteristic curves C1 and C2 is defined as a static noise margin SNM. Generally, the larger the static noise margin SNM is, the higher the cell data stability is. In other words, data destruction due to power supply voltage noise hardly occurs in a chip provided with the SRAM.

When devices or cells become small, the design rule decreases to, e.g., about 0.09 μm, the power supply voltage VDD lowers to, e.g., about 1.2V, and the static noise margin SNM becomes small. It is important to ensure a large static noise margin SNM in designing an SRAM cell.

Two methods are mainly available to design an SRAM cell having a large static noise margin SNM.

As the first method, the x-coordinate of a point C at which the first input/output characteristic curve C1 starts dropping from a high level "H" and the y-coordinate of a point D1 at which the second input/output characteristic curve C2 starts dropping from a high level "H" are set to large values, as shown in FIG. 6. To do this, a threshold value Vthna of each of two driver transistors arranged in the first and second inverters is increased. However, the current drivability of the driver transistors deteriorate accordingly to decrease the cell current, resulting in a decrease in data read speed of the cell.

As the second method, a potential VA at the y-coordinate of the intersection A between the two input/output characteristic curves C1 and C1 and a potential VB1 at the x-coordinate of the intersection B1 are set to small values, as shown in FIG. 6. The potential VA corresponds to the first storage node potential VNA when the input of the first inverter is the power supply voltage VDD.

To decrease the potential VA, the current drivability of the transfer gate transistor may be decreased, or the current drivability of the driver transistor may be increased, as is known.

However, when the current drivability of the transfer gate transistor is decreased, the cell current decreases, resulting in a decrease in the data read speed. When the current drivability of the driver transistor is increased, the cell area increases, as is known.

As described above, in the conventional SRAM cell and an integrated memory circuit using the SRAM cell, if the static noise margin SNM indicated in the butterfly curve is increased to improve the stability of cell data the read speed decreases due to a decrease in cell current, or the cell area increases.

BRIEF SUMMARY OF THE INVENTION

According to one aspect of the present invention, there is provided an SRAM cell comprising a first inverter including a first load element and a first driver NMOSFET, a second inverter including a second load element and a second driver NMOSFET and having input and output terminals cross-coupled to output and input terminals of the first inverter, a first transfer gate NMOSFET having a drain-to-source path inserted between the output terminal of the first inverter and a first bit line and a gate connected to a word line, and a second transfer gate NMOSFET having a drain-to-source path inserted between the output terminal of the second inverter and a second bit line and a gate connected to the word line, wherein a current drivability of the first inverter and the first transfer gate NMOSFET for the first bit line is set to be larger than a current drivability of the second inverter and the second transfer gate NMOSFET for the second bit line.

According to another aspect of the present invention, there is provided an SRAM cell comprising a first inverter including a first load element and a first driver NMOSFET, a second inverter including a second load element and a second driver NMOSFET and having input and output terminals cross-coupled to output and input terminals of the first inverter, and a transfer gate NMOSFET having a drain-to-source path inserted between the output terminal of the first inverter and a bit line and a gate connected to a word line, wherein a current drivability of the first inverter for the bit line is set to be larger than a current drivability of the second inverter.

According to further aspect of the present invention, there is provided an integrated memory circuit comprising a cell array in which a plurality of SRAM cells of the above-mentioned one aspect are arranged in directions of column and row, a first bit line and a second bit line, which are respectively commonly connected to one terminal of a first transfer gate NMOSFET and one terminal of a second transfer gate NMOSFET of each of SRAM cells provided in the column in the cell array, a word line which is commonly connected to a gate of the first transfer gate NMOSFET and a gate of the second transfer gate NMOSFET of each of the SRAM cells in the row in the cell array, and an amplification circuit which is connected to the first bit line, wherein in reading data from an SRAM cell, the word line is activated to read data on the first bit line through the amplification circuit.

According to still another aspect of the present invention, there is provided an integrated memory circuit comprising a cell array in which a plurality of SRAM cells of the another aspect are arranged in directions of column and row, a bit line which is commonly connected to one terminal of a transfer gate NMOSFET of each of the SRAM cells in the column in the cell array, a word line which is commonly connected to a gate of the transfer gate NMOSFET of each of the SRAM cells in the row in the cell array, and an amplification circuit which is connected to the bit line, wherein in reading data from an SRAM cell, the word line is activated to read data on the bit line through the amplification circuit.

DETAILED DESCRIPTION OF THE INVENTION

The embodiments of the present invention will be described below in detail with reference to the accompanying drawing.

<First Embodiment>

Figure 1:
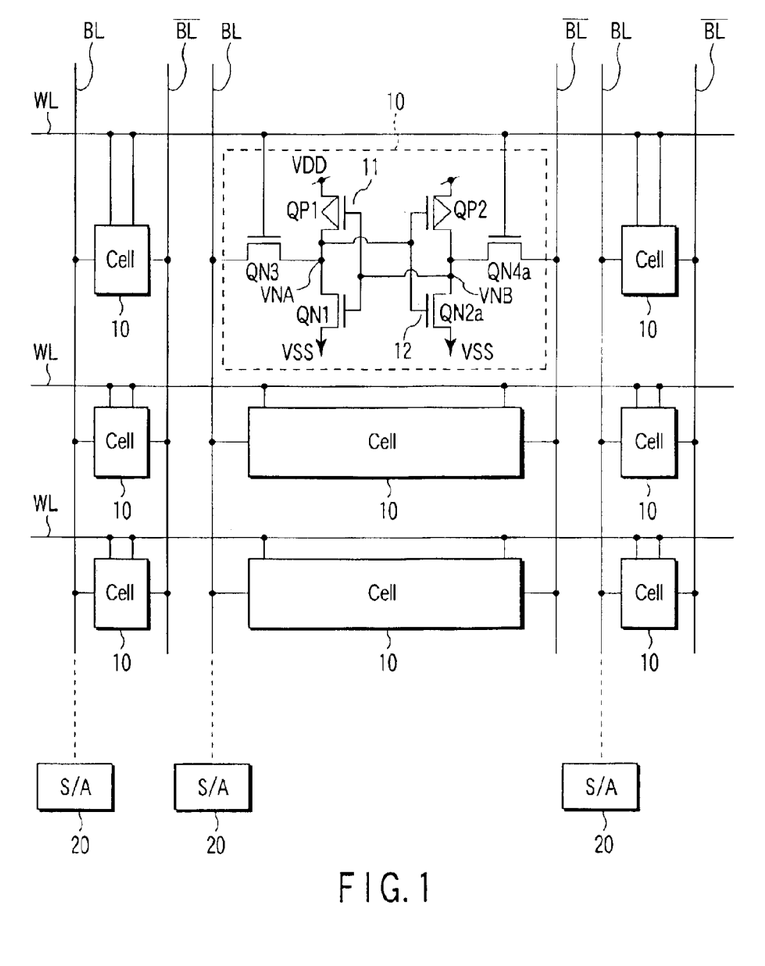
FIG. 1 is a circuit diagram showing a part of an SRAM cell array having 6Tr (6-transistor) SRAM cells arrayed in a matrix, according to a first embodiment of the present invention.

FIG. 1 shows a part of an SRAM cell array in which 6-transistor SRAM cells according to the first embodiment are arrayed in a matrix. A plurality of pairs of bit lines BL and /BL are extended in column direction and a plurality of SRAM cells 10 are arranged in each pair of bit lines BL and /BL. A plurality of word lines WL are arranged in row direction perpendicular to the column direction.

Each SRAM cell 10 includes a first inverter 11 and a second inverter 12 of CMOS type which have cross-coupled input and output terminals. The first inverter 11 includes a first driver transistor QN1 of NMOS type and a transistor QP1 serving as the first load element transistor of PMOS type. The second inverter 12 includes a second driver transistor QN2a of NMOS type and a transistor QP2 serving as the second load element transistor of PMOS type.

The output terminals of the first inverter 11 and the second inverter 12 are respectively connected to bit lines BL and /BL through a first transfer gate transistor QN3 and a second transfer gate transistor QN4a of NMOS type, respectively.

The output terminal of the first inverter 11 and the output terminal of the second inverter 12 form a pair of storage nodes of the SRAM cell 10 holding complementary data "0" and "1" or "1" and "0". The output terminal of the first inverter 11 will be referred to as a first storage node, and the output terminal of the second inverter 12 will be referred to as a second storage node.

The gates of the first transfer gate transistor QN3 and second transfer gate transistor QN4a are commonly connected to the word line WL. Latch-type sense amplifiers 20 are connected to one bit line BL in each of complementary bit line pairs BL and /BL.

The SRAM using the 6-transistor SRAM cells 10 shown in FIG. 1 has the following characteristic features (1) to (3) as compared to an SRAM cell array using a conventional 6-transistor SRAM cell.

(1) The data read sense amplifier (S/A) 20 is connected to only one bit line (bit line BL in this embodiment, for example) of the bit line pair BL and /BL. In the data read mode, only the bit line BL of the bit line pair BL and /BL is used. This read mode single bit line scheme for the data read operation is similar to that described in a reference by K. Zhang et al, "The Scaling of Data Sensing Schemes for High Speed Cache Design in Sub-0.18 µm Technologies", in 2000 Symp. on VLSI Circuits Digest of Technical Papers, pp. 226–227. The entire contents of this reference for this read mode single bit line scheme for the data read operation are incorporated herein by reference.

(2) A threshold value Vthnb of the second driver transistor QN2a of the data holding inverter 12 which receives at its gate the output from the read bit line driver inverter 11 is set to be larger than the threshold value Vthna of the first driver transistor QN1 of the read bit line driver inverter 11 connected to the read bit line BL through the first transfer gate transistor QN3.

(3) A $\beta$ ratio (first $\beta$ ratio) of the first driver transistor QN1 to the first transfer gate transistor QN3 is set to be lower than a $\beta$ ratio (second $\beta$ ratio) of the second driver NMOS transistor QN2a to the second transfer gate transistor QN4a.

The $\beta$ ratio is defined by a ratio Wd/Ld of a driver transistor in an inverter to a ratio Wt/Lt of a transfer gate transistor connected to an output terminal of the inverter. Where, Wd and Wt represent gate widths of the driver transistor and the transfer gate transistor and Ld and Lt represent gate lengths thereof.

In order to make the second $\beta$ ratio of the second driver NMOS transistor QN2a to the second transfer gate transistor QN4a feature (3) be large, the ratio Wd/Ld of the transistor QN2a may be increased and/or the ratio Wt/Lt of the transistor QN4a may be decreased. It is known that the ratios Wd/Ld and Wt/Lt represent current drivabilities of the corresponding transistors QN2a and QN4a.

In this first embodiment, the gate width Wt of the transfer gate transistor QN4a is made small to decrease the ratio Wt/Lt so that the current drivability of the transistor QN4a is decreased and the second β ratio is also increased. A pattern layout of the SRAM cell 10 denoting the gate width, gate length and the like will be described in detail later by referring to FIG. 2.

In other words, in this embodiment, the current drivability of the first transfer gate transistor QN3 and first driver NMOS transistor QN1 for the first bit line BL is set to be larger than the current drivability of the second transfer gate transistor QN4a and second driver NMOS transistor QN2a for the other bit line /BL (second bit line).

In reading data from the SRAM cell 10 shown in FIG. 1, the word line WL is activated to turn on one of the first driver transistor QN1 and second driver transistor QN2a in accordance with the levels of potentials corresponding to stored data, i.e., the high level "H" and low level "L" of the pair of storage nodes of the SRAM cell 10.

When the level VNA at the first storage node is "L", the transfer gate transistor QN3 turns on and a cell current Icell is supplied to one bit line BL connected to the driver transistor QN1, thereby driving the bit line BL to the "L" side, whereby this potential change is sensed by the sense amplifier S/A 20. When the first storage node is "H", no cell current flows and the sense amplifier S/A 20 senses this state.

In writing data in the SRAM cell 10, the word line WL is activated to set the potentials VNA and VNB of the pair of storage nodes of the SRAM cell 10 in correspondence with the complementary data of the bit lines BL and /BL, thereby storing data in the SRAM cell 10.

Figure 2:
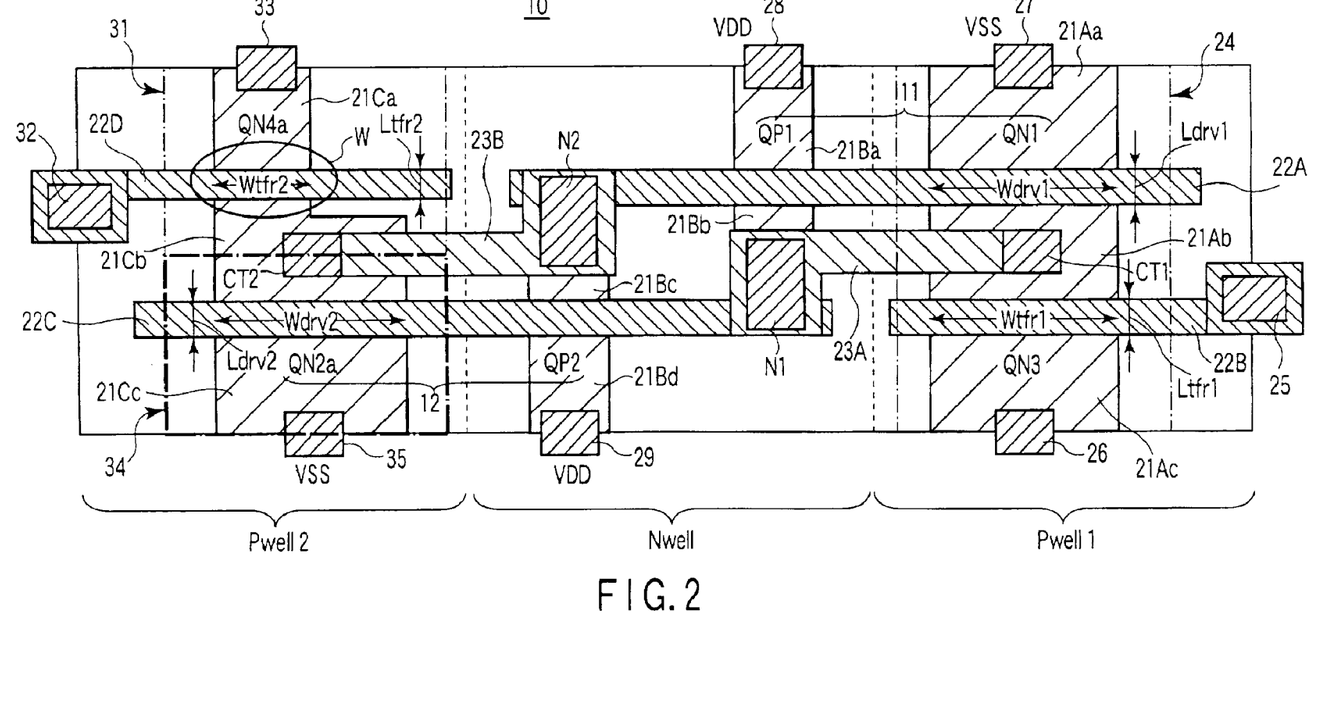
FIG. 2 is a plan view showing an example of a pattern layout of the SRAM cell shown in FIG. 1 formed on a semiconductor substrate.

FIG. 2 is a plan view showing an example of the pattern layout of the SRAM cell 10 shown in FIG. 1 formed on a semiconductor substrate.

Referring to FIG. 2, the first driver transistor QN1 and first transfer gate transistor QN3 are formed in a first p-well Pwell1. The first load transistor QP1 and second load transistor QP2 are formed in an n-well Nwell. The second driver transistor QN2a and second transfer gate transistor QN4a are formed in a second p-well Pwell2.

In the first p-well Pwell1, reference numeral 24 shown by a one-dot-dash line denotes a channel ion implantation region of the transistors QN1 and QN3. In the channel ion implantation region 24 there are formed source/drain diffusion regions 21Aa, 21Ab, 21Ac. A gate electrode 22A is formed between the diffusion regions 21Aa and 21Ab to form the driver transistor QN1. A gate electrode 22B is formed between the diffusion regions 21Ab and 21Ac to form the transfer gate transistor QN3.

On one end of the gate electrode a word line contact 25 is formed and a bit line contact 26 is formed on the diffusion region 21Ac. Further, is formed on the diffusion region 21Aa a VSS contact 27 which connects the source region 21Aa of the first driver transistor QN1 to a ground potential VSS. A contact CT1 connected between the transistors QN1 and QN3 is formed at an end of a local wiring 23A between the gate electrodes 22A and 22B.

In the n-well Nwell region, reference numeral 28 denotes a VDD contact which connects the source region 21Ba of the first load transistor QP1 to the power supply voltage VDD. The load transistor QP1 is formed between the source region 21Ba and a drain region 21Bb using the gate electrode 22A in common with the transistor QN1. The second load transistor QP2 is formed between drain and source diffusion regions 21Bc and 21Bd using a gate electrode 22C. A VDD contact 29 connecting the source region 21Bd of the second load transistor QP2 to the power supply voltage VDD is formed at the other end of the source region 21Bd. The first storage node N1 is formed between the local wiring 23A and the gate electrode 22C, and the second storage node N2 is formed between the gate electrode 22A and the local wiring 23B.

In the second p-well Pwell2, reference numeral 31 denotes a channel ion implantation region of the transistors QN2a and QN4a. The transistors QN4a and QN2a are formed between the source region 21Ca and the drain region 21Cb, and between the drain region 21Cb and the source region 21Cc at the gate electrodes 22C and 22D, respectively. A word line contact 32 is formed at an end of the gate electrode 22D and a bit line contact is formed at one end of the source region 21Ca, and a VSS contact 35 connecting the source region 21Cc of the second driver transistor QN2a to the ground potential VSS is formed. Further, a channel ion implantation region 34 of the second driver transistor QN2a serving as a data keeper on the write bit line side /B1 is formed at a range denoted by a thick dot-and-dash line, thereby increasing an impurity concentration of the region 34 than that of the ion implantation region 31. The increase of the impurity concentration at the region 34 causes the increase of the threshold value Vth of the driver transistor QN2a as will be described later to realize the above-mentioned second feature (2). The local wiring 23B is connected to the drain region 21Cb at a contact CT2.

In addition, to realize the structural characteristic feature (3), a gate width Wtfr1 and gate length Ltfr1 of the first transfer gate transistor QN3, a gate width Wdrv1 and gate length Ldrv1 of the first driver transistor QN1, a gate width Wtfr2 and gate length Ltfr2 of the second transfer gate transistor QN4a, and a gate width Wdrv2 and gate length Ldrv2 of the second driver transistor QN2a are designed to satisfy a relation given by $$1.2 \times (Wdrv1/Ldrv1)/(Wtfr1/Ltfr1) < (Wdrv2/Ldrv2)/(Wtfr2/Ltfr2) \quad (1)$$

Where, the FIG. 1.2 may be determined as any value to ensure that the relation given by the inequality (1) is satisfied in view of the manufacturing tolerance of the sizes of the transistors in the SPAM cell 10. Therefore, in the case where the manufacturing error is zero, the FIG. 1.2 may be changed to 1.

In this embodiment, the gate width Wdrv1 of the transistor QN1 equals the gate width Wdrv2 of the transistor QN2a. The gate length Ldrv1 equals the gate length Ldrv2. The gate length Ltfr1 equals the gate length Ltfr2. The gate width Wtfr2 of the transfer gate transistor QN4a is designed to be smaller than the gate width Wtfr1 of the transfer gate transistor QN3 so that the second β ratio is made larger than the first β ratio as mentioned above.

In this embodiment, the first load transistor QP1 and second load transistor QP2 are designed to have an absolute threshold value—|Vthna| which equals that of the threshold value Vthna of the first driver transistor QN1 of the read bit line driver inverter 11.

The functions and effects of the structural characteristic feature (1) will be described next in detail.

In the read mode, the word line WL is activated to turn on both the first transfer gate transistor QN3 and the second transfer gate transistor QN4a. Cell data read out to one bit line BL is amplified by the sense amplifier 20 and output as a read data.

For the cell current Icell that contributes to the data read speed, only the current drivability of the first transfer gate transistor QN3 and first driver transistor QN1 connected to one bit line BL on the read side needs to be taken into consideration. The size of the second transfer gate transistor QN4a and second driver transistor QN2a does not influence the data read speed.

In write operation, the word line WL is activated to set the potentials VNA and VNB of the pair of storage nodes N1, N2 of the SRAM cell 10 in correspondence with the data on the bit lines BL and /BL.

Now, the functions and effects of the structural characteristic features (2) and (3) will be described next in detail with reference to FIG. 3.

Figure 3:
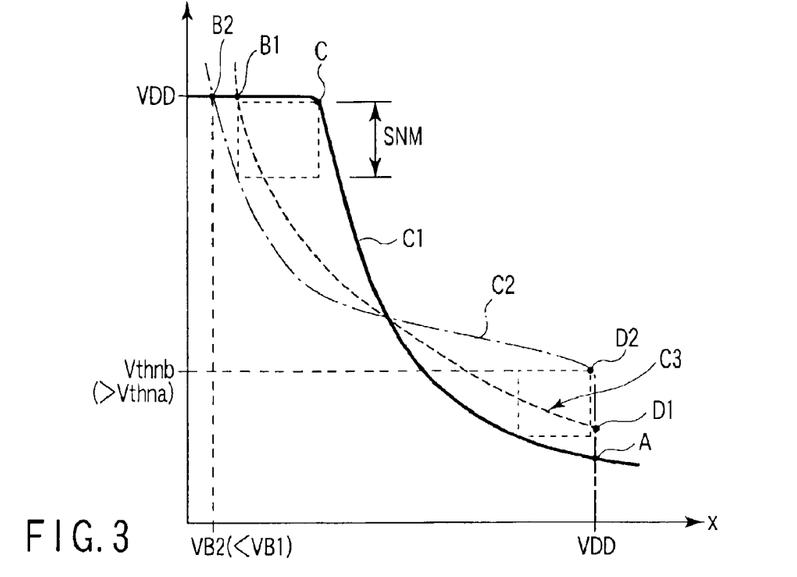
FIG. 3 is a graph showing the butterfly curve of the SRAM cell shown in FIG. 1.

FIG. 3 is a graph showing the butterfly curve of the SRAM cell 10 shown in FIGS. 1 and 2.

Assume that the first transfer gate transistor QN3 and first driver transistor QN1 have the same size and threshold value as in the case of the prior art of FIG. 6. Therefore, an input/output characteristic curve C1 of the first inverter 11 is the same as in the prior art shown in FIG. 6. The cell current Icell which drives the read-side bit line BL is also the same as in the prior art. However, an input/output characteristic curve C2 of the second inverter 12 changes from that of the prior art.

Because of the characteristic feature (2), the point at which the input/output characteristic curve C2 of the second inverter 12 starts dropping from high level "H" shifts from a point D1 in the prior art to a point D2 as shown in FIG. 3. This corresponds to the increase of the threshold value of the second driver transistor QN2a from Vthna to Vthnb caused by the high impurity concentration region 34 in FIG. 2. Accordingly, the inscribed square on the side of an intersection A between the two input/output characteristic curves C1 and C2 becomes larger than that of the prior art.

On the other hand, because of the characteristic feature (3), an intersection B1 in the prior art shifts to an intersection B2 on the side of the other intersection B2 between the two input/output characteristic curves C1 and C2. More specifically, this corresponds to the decrease in second storage node (N2) potential VNB when the input of the second inverter 12 is the power supply voltage VDD because of the second β ratio set to high due to the small gate width Wtfr2 of the second transfer gate transistor QN4a. Hence, the inscribed square on the side of the intersection B2 also becomes larger than that of the prior art.

As described above, a static noise margin SNM of the SRAM cell 10 according to the first embodiment becomes larger than that of the prior art SRAM cell shown in FIG. 6. Actually, the size of the second transfer gate transistor QN4a and second driver transistor QN2a are set such that the two inscribed squares with respect to the two intersections A and B2 have almost the same size. This aims at almost equalizing the logic stabilities of "1" data and "0" data.

In the structural characteristic feature (3), as an actual method of increasing the second β ratio, the gate width Wtfr2 of the second transfer gate transistor QN4a is set to be small, as indicated by a region W shown by an ellipse in FIG. 2. With this setting, the size of the SRAM cell 10 according to the first embodiment does not become larger than the size of the conventional SRAM cell.

Figure 4:
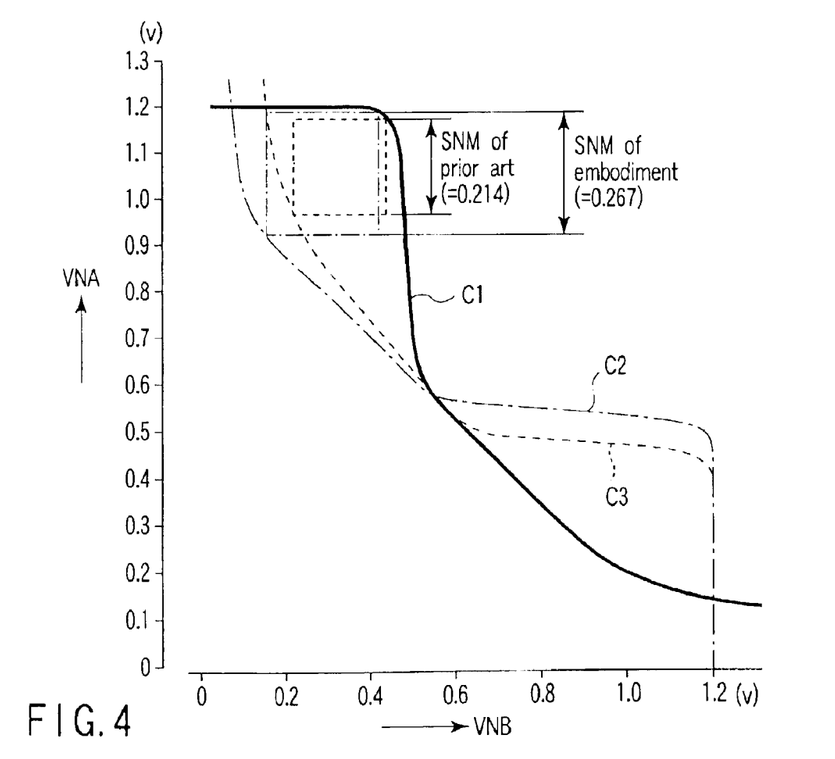
FIG. 4 is a graph showing the comparison between the simulation result of butterfly curve of a conventional SRAM cell and that of the SRAM cell according to the first embodiment shown in FIG. 1.

FIG. 4 is a graph showing the comparison between the simulation result of butterfly curve (obtained when a 90 nm-generation process is used, and the power supply voltage VDD is 1.2V) of a conventional SRAM cell and that of the SRAM cell 10 according to the first embodiment shown in FIGS. 1 and 2. The characteristic curves C1 and C2 are the input/output characteristic curves of the first inverter 11 and second inverter 12 in the SRAM cell 10 according to the first embodiment, respectively, and C3 is the input/output characteristic curve of an inverter in the conventional SRAM cell corresponding to the second inverter 12.

In this case, the parameters of each transistor of the SRAM cell 10 are as follows. For the first transfer gate transistor QN3, Wtfr1/Ltfr1=0.24 $\mu$m/0.07 $\mu$m and Vth=0.45V. For the second transfer gate transistor QN4a, Wtfr2/Ltfr2=0.12 $\mu$m/0.07 $\mu$m and Vth=0.45V. For the first driver transistor QN1, Wdrv1/Ldrv1=0.35 $\mu$m/0.07 $\mu$m and Vth=0.45V. For the second driver transistor QN2a, Wdrv2/Ldrv2=0.35 $\mu$m/0.07 $\mu$m and Vth=0.55V.

To the contrary, for the transistors of the prior art SRAM cell, which correspond to the first transfer gate transistor QN3 and second transfer gate transistor QN4a, W/L=0.24 $\mu$m/0.07 $\mu$m and Vth=0.45V. For the first driver transistor QN1 and second driver transistor QN2a, W/L=0.35 $\mu$m/0.07 $\mu$m and Vth=0.45V.

As is apparent from FIG. 4, the SRAM cell 10 has SNM=0.267, which is larger than that of the prior art SRAM cell (SNM=0.214) by about 25%. That is, the cell stability increases.

In the first embodiment, since the transistor size is the same as that in the prior art SRAM cell except the gate width Wtfr1 of the second transfer gate transistor QN4a is smaller, the cell size does not increase. In addition, the size and threshold value of the first transfer gate transistor QN3 and first driver transistor QN1 are the same as those in the prior art. The cell current for the read-side bit line BL is also the same as in the prior art.

As described above, in the first embodiment, even when devices become small, the design rule decreases to, e.g., about 0.09 $\mu$m, and the power supply voltage VDD lowers to, e.g., about 1.2V, the static noise margin SNM of the SRAM cell 10 can be increased to increase the stability of cell data without decreasing the cell current or increasing the cell size by setting the threshold value Vthnb of the second driver transistor QN2a to be more than the threshold value Vthna of the first driver transistor QN1 by, e.g., 50 mV or more.

<Modification to First Embodiment>

In the first embodiment, a 6-transistor SRAM cell in which two inverters 11, 12 each having transistors QP1, QP2 as load elements are cross-connected has been described. The present invention can also be applied to a 4-transistor+2-resistive-element type SRAM cell in which two inverters each having resistive elements (not shown) as load elements are cross-connected. The structure of the 4-transistor+2-resistive-element type SRAM cell is well-known and the description thereof may be omitted here.

<Second Embodiment>

Figure 5:
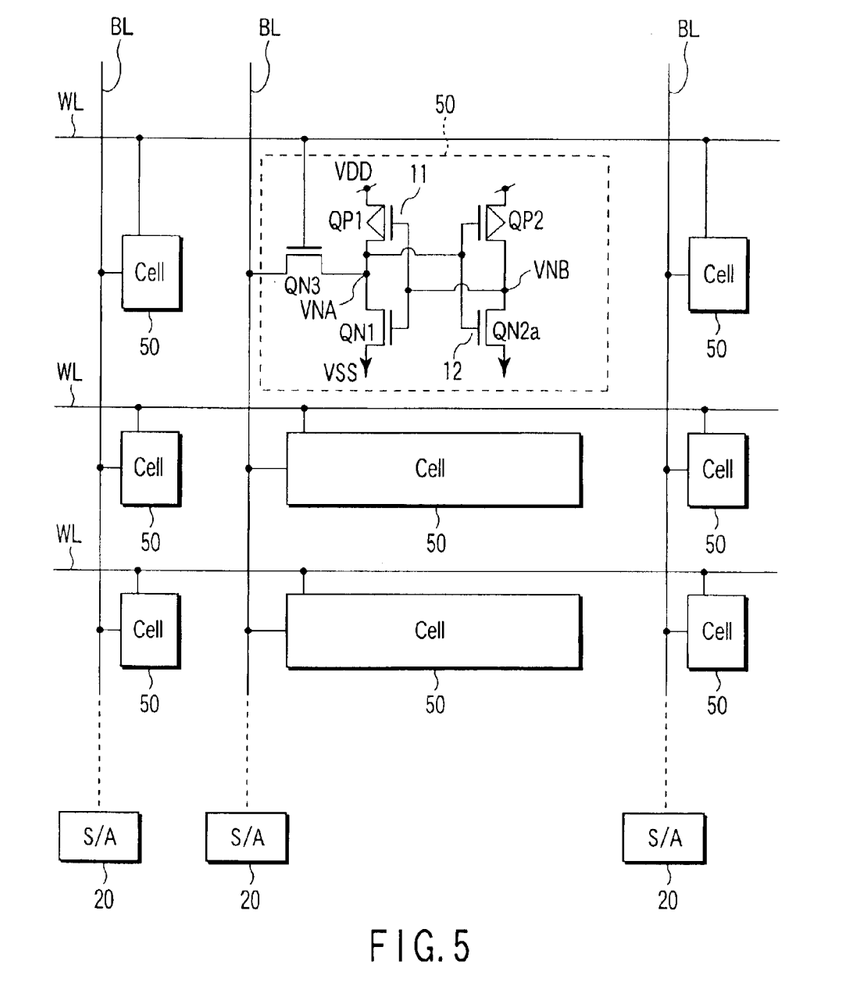
FIG. 5 is a circuit diagram showing a part of an SRAM cell array arrayed in a matrix including 5Tr (5-transistor) SRAM cells, according to a second embodiment of the present invention.

FIG. 5 shows part of an SRAM having a cell array in which 5-transistor SRAM cells according to the second embodiment of the present invention are arrayed in a matrix.

A 5-transistor SRAM cell 50 shown in FIG. 5 has the same arrangement as that of the 6-transistor SRAM cell 10 described above with reference to FIGS. 1 and 2 except that the second transfer gate transistor QN4a and the bit line /BL connected to it are omitted. The same reference numerals as in FIGS. 1 and 2 therefore denote the same parts in FIG. 5.

The 5-transistor SRAM cell 50 having only one transistor QN3 serving as a transfer gate transistor employs a single bit line scheme as disclosed in, e.g., U.S. Pat. No. 5,831,896. Therefore, the contents of U.S. Pat. No. 5,831,896 with respect to the single bit line scheme are incorporated herein by reference. The SRAM cell 50 executes not only a data read but also a data write using the single bit line BL. To write "1" data, the potential of the word line WL must be boosted to VDD or more.

Even in the second embodiment, the stability of cell data can be increased without decreasing the cell current or increasing the cell size due to the same reason as in the first embodiment by setting a threshold value Vthnb of the second driver transistor QN2a to be more than a threshold value Vthna of a first driver transistor QN1 and setting the current drivability of a first inverter 11 for the bit line BL to be larger than the current drivability of a second inverter 12.

Namely, the second transfer gate transistor QN4a is omitted. In other words, the value Wtfr2 in the inequality (1) becomes zero. This corresponds to setting the second β ratio with respect to the second transfer gate transistor QN4a and the second driver transistor QN2a, which is represented by the right-hand member of the inequality (1), to be higher than the first β ratio with respect to the first transfer gate transistor QN3 and the first driver transistor QN1 which is represented by the left-hand member of inequality (1), because this case corresponds to Wtfr2=0. Hence, the static noise margin SNM of the SRAM cell 50 further increases.

In the above embodiments, SRAM integrated circuits have been described. However, the present invention can also be applied to an integrated memory circuit such as an SRAM-embedded integrated logic circuit.

As described above, according to the present invention, there can be provided an SRAM cell which increases the cell data stability without decreasing the cell current or without increasing the cell area as well as an integrated memory circuit using the SRAM cell thus configured.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An SRAM cell comprising:

a first inverter comprising a first load element and a first driver NMOSFET;

a second inverter comprising a second load element and a second driver NMOSFET and having input and output terminals cross-coupled to output and input terminals of the first inverter, respectively;

a first transfer gate NMOSFET having a drain-to-source path inserted between the output terminal of the first inverter and a first bit line and a gate connected to a word line; and a second transfer gate NMOSFET having a drain-to-source path inserted between the output terminal of the second inverter and a second bit line and a gate connected to the word line, wherein a current drivability of the first inverter and the first transfer gate NMOSFET for the first bit line is set to be larger than a current drivability of the second inverter and the second transfer gate NMOSFET for the second bit line.

2. The SRAM cell according to claim 1, wherein each of the first load element and the second load element is a PMOSFET.

3. The SRAM cell according to claim 1, wherein a threshold value of the second driver NMOSFET is set to be larger than that of the first driver NMOSFET, and a following relation holds:

$$(Wdrv1/Ldrv1)/(Wtfr1/Ltfr1) < (Wdrv2/Ldrv2)/(Wtfr2/Ltfr2)$$

where Wtfr1 denotes a gate width and Ltfr1 denotes a gate length of the first transfer gate NMOSFET, Wdrv1 denotes a gate width and Ldrv1 denotes a gate length of the first driver NMOSFET, Wtfr2 denotes a gate width and Ltfr2 denotes a gate length of the second transfer gate NMOSFET, and Wdrv2 denotes a gate width and Ldrv2 denotes a gate length of the second driver NMOSFET.

4. The SRAM cell according to claim 3, wherein the threshold value of the second driver NMOSFET is set to be larger than that of the first driver NMOSFET by adjusting an amount of channel ion implantation with respect to that of the first driver NMOSFET.

5. The SRAM cell according to claim 3, wherein the gate width Wdrv1 equals the gate width Wdrv2, the gate length Ldrv1 equals the gate length Ldrv2, the gate length Ltfr1 equals the gate length Ltfr2, and the gate width Wtfr2 is smaller than the gate width Wtfr1.

6. The SRAM cell according to claim 4, wherein the gate width Wdrv1 equals the gate width Wdrv2, the gate length Ldrv1 equals the gate length Ldrv2, the gate length Ltfr1 equals the gate length Ltfr2, and the gate width Wtfr2 is smaller than the gate width Wtfr1.

7. The SRAM cell according to claim 3, wherein the threshold value of the second driver NMOSFET is set to be larger than that of the first driver NMOSFET by not less than 50 mV and satisfy a relation:

$$1.2 \times (Wdrv1/Ldrv1)/(Wtfr1/Ltfr1) < (Wdrv2/Ldrv2)/(Wtfr2/Ltfr2).$$

8. An SRAM cell comprising:

a first inverter including a first load element and a first driver NMOSFET;

a second inverter including a second load element and a second driver NMOSFET and having input and output terminals cross-coupled to output and input terminals of the first inverter, respectively; and a transfer gate NMOSFET having a drain-to-source path inserted between the output terminal of the first inverter and a bit line and a gate connected to a word line, wherein a current drivability of the first inverter for the bit line is set to be larger than a current drivability of the second inverter.

9. The SRAM cell according to claim 8, wherein each of the first load element and the second load element includes a PMOSFET.

10. The SRAM cell according to claim 8, wherein a threshold value of the second driver NMOSFET is set to be larger than that of the first driver NMOSFET.

11. The SRAM cell according to claim 10, wherein the threshold value of the second driver NMOSFET is set to be larger than that of the first driver NMOSFET by adjusting an amount of channel ion implantation with respect to that of the first driver NMOSFET.

12. The SRAM cell according to claim 10, wherein the threshold value of the second driver NMOSFET is set to be larger than that of the first driver NMOSFET by not less than 50 mV.

13. The SRAM cell according to claim 11, wherein the threshold value of the second driver NMOSFET is set to be larger than that of the first driver NMOSFET by not less than 50 mV.

14. An integrated memory circuit comprising:

a cell array in which a plurality of SRAM cells according to claim 9 are arranged in a matrix;

a bit line which is commonly connected to one terminal of a transfer gate NMOSFET of each of the SRAM cells in a column in the cell array;

a word line which is commonly connected to a gate of the transfer gate NMOSFET of each of the SRAM cells in a row in the cell array; and an amplification circuit which is connected to the bit line, wherein in reading data from the SRAM cells, the word line is activated to read data on the bit line through the amplification circuit.

* * * * *